US012642130B2

(12) United States Patent
Feng et al.

(10) Patent No.: US 12,642,130 B2
(45) Date of Patent: May 26, 2026

(54) HYBRID BONDING A DIE TO A SUBSTRATE WITH VIAS CONNECTING METAL PADS ON BOTH SIDES OF THE DIE

(71) Applicant: Intel Corporation, Santa Clara, CA (US)

(72) Inventors: Hongxia Feng, Chandler, AZ (US); Xiaoxuan Sun, Phoenix, AZ (US); Amey Anant Apte, Chandler, AZ (US); Dingying David Xu, Chandler, AZ (US); Sairam Agraharam, Chandler, AZ (US); Gang Duan, Chandler, AZ (US); Ashay Dani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 17/709,367

(22) Filed: Mar. 30, 2022

(65) Prior Publication Data
US 2023/0317653 A1      Oct. 5, 2023

(51) Int. Cl.
| | |
|---|---|
| *H10W 90/00* | (2026.01) |
| *H10W 70/60* | (2026.01) |
| *H10W 72/00* | (2026.01) |
| *H10W 72/20* | (2026.01) |
| *H10W 72/90* | (2026.01) |
| *H10W 80/00* | (2026.01) |

(52) U.S. Cl.
CPC ............ *H10W 90/00* (2026.01); *H10W 70/60* (2026.01); *H10W 72/01951* (2026.01); *H10W 72/0198* (2026.01); *H10W 72/07338* (2026.01);

*H10W 72/244* (2026.01); *H10W 72/942* (2026.01); *H10W 72/944* (2026.01); *H10W 72/951* (2026.01); *H10W 72/952* (2026.01); *H10W 72/953* (2026.01); *H10W 80/333* (2026.01); *H10W 90/701* (2026.01); *H10W 90/794* (2026.01)

(58) Field of Classification Search
CPC ...................................................... H01L 24/08
See application file for complete search history.

(56) References Cited

U.S. PATENT DOCUMENTS

| | | | | |
|---|---|---|---|---|
| 8,872,349 | B2 * | 10/2014 | Chiu ................... | H01L 23/5381 |
| | | | | 257/E23.145 |
| 11,233,088 | B2 * | 1/2022 | Chen ..................... | H10F 39/026 |
| 2015/0333056 | A1 * | 11/2015 | Du .......................... | H10D 88/00 |
| | | | | 257/773 |
| 2018/0012868 | A1 * | 1/2018 | Huang ............... | H01L 25/0657 |
| 2019/0006264 | A1 * | 1/2019 | Vaidya ............... | H01L 25/0655 |
| 2019/0252444 | A1 * | 8/2019 | Ryoki ................... | H10F 39/018 |
| 2020/0135617 | A1 * | 4/2020 | Shen ..................... | H01L 23/481 |
| 2021/0391376 | A1 * | 12/2021 | Chen .................... | H10F 39/026 |
| 2022/0399305 | A1 * | 12/2022 | Choi .................... | H01L 23/552 |

(Continued)

*Primary Examiner* — William A Harriston
(74) *Attorney, Agent, or Firm* — Schwabe, Williamsom & Wyatt, P.C.

(57) ABSTRACT

Embodiments herein relate to systems, apparatuses, techniques or processes for hybrid bonding a die to a substrate. In embodiments, the die may be a chiplet that is bonded to an interconnect. In embodiments, the die may be a plurality of dies, where the plurality of dies are hybrid bonded to a substrate, to each other, or a combination of both. Other embodiments may be described and/or claimed.

20 Claims, 13 Drawing Sheets

(56)                    References Cited

U.S. PATENT DOCUMENTS

2023/0085411 A1 *   3/2023   Paital ...................... H01L 24/19
                                                          257/621
2024/0063127 A1 *   2/2024   Ecton ................. H01L 25/0655
2024/0071976 A1 *   2/2024   Zhou ................... H01L 21/6835
2024/0258277 A1 *   8/2024   Kwon ................. H01L 25/0657
2024/0321851 A1 *   9/2024   Yim ........................ H01L 24/73
2024/0379601 A1 *  11/2024   Huang ............... H01L 23/3677

* cited by examiner

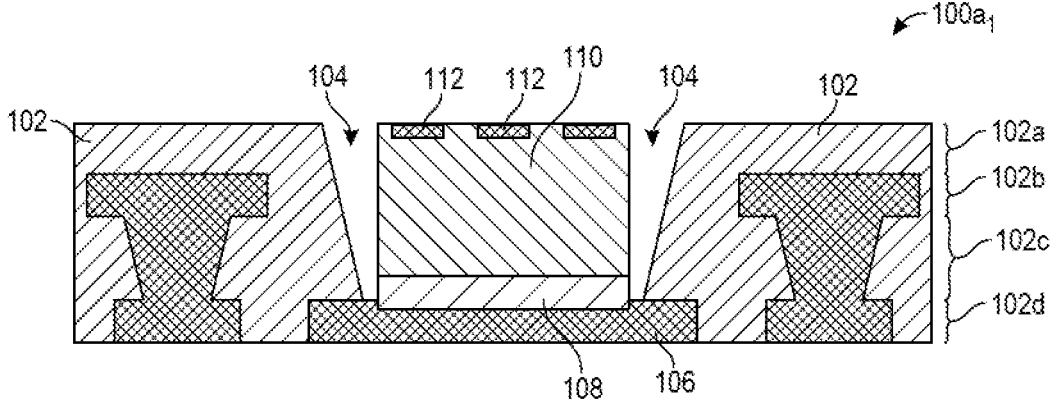
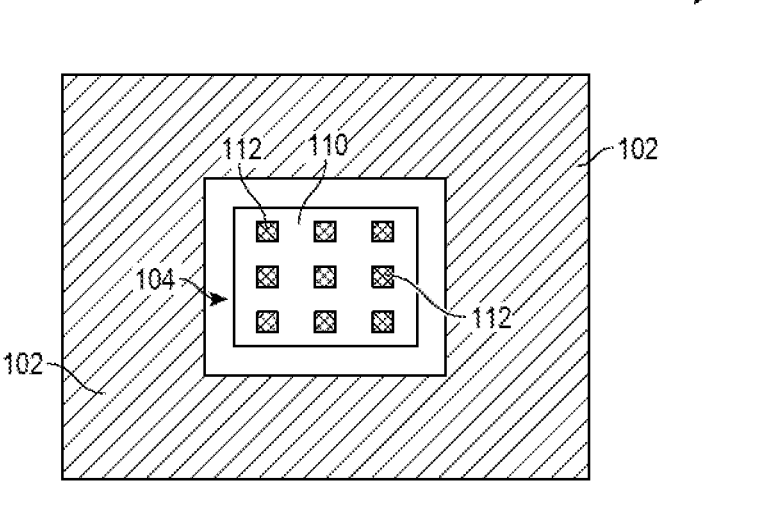
FIG. 1A

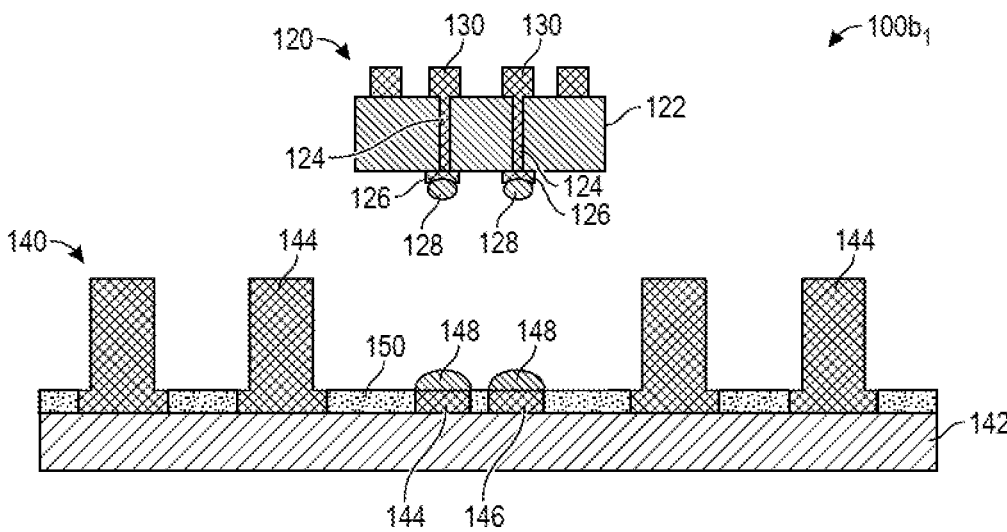
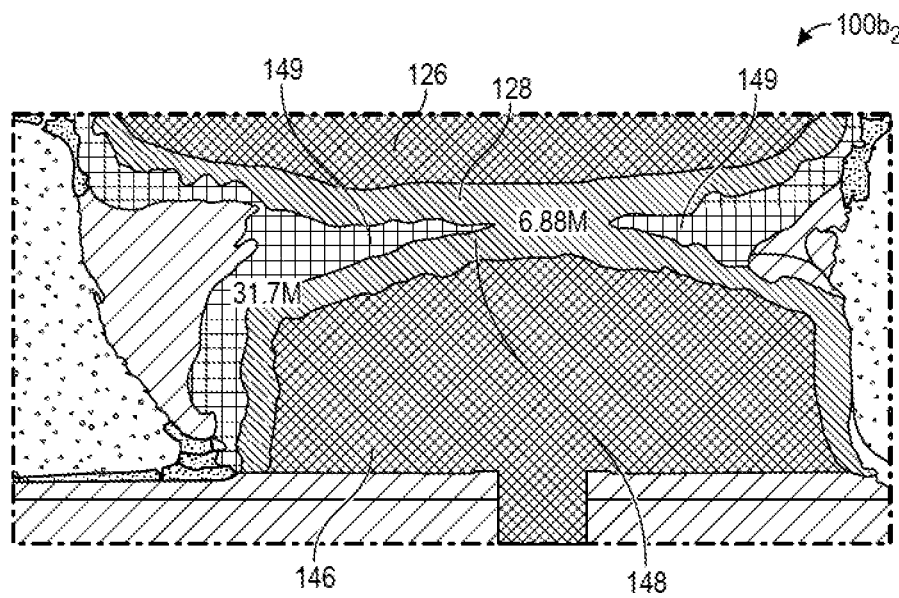
FIG. 1B

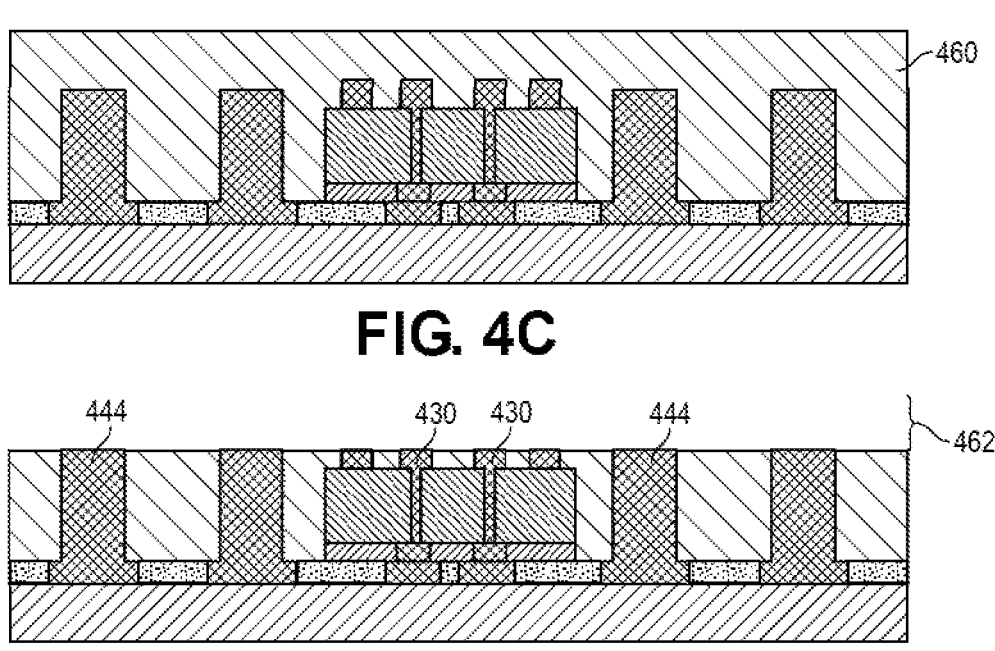
FIG. 4C
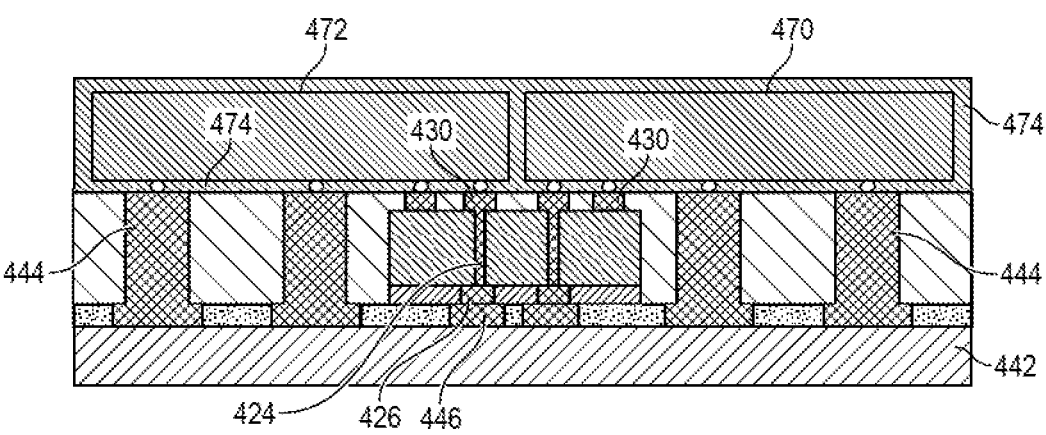
FIG. 4D
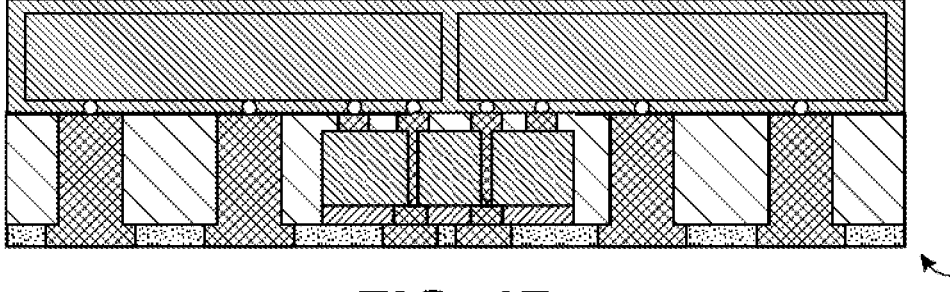
FIG. 4E
FIG. 4F

592

522

527b
590

588

520

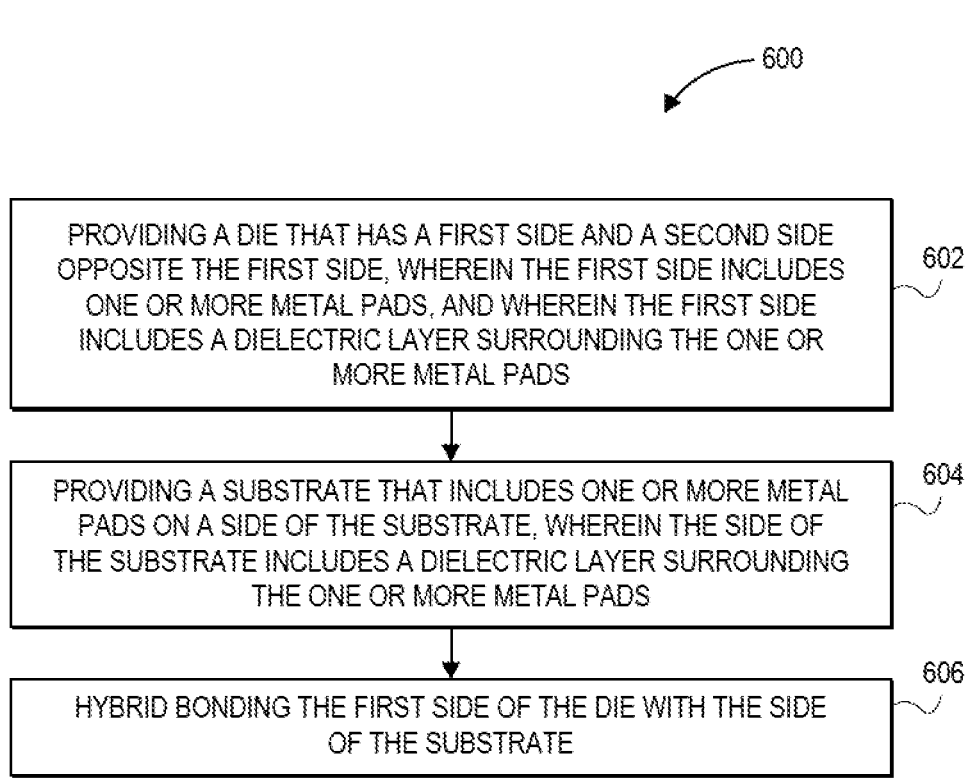

600

PROVIDING A DIE THAT HAS A FIRST SIDE AND A SECOND SIDE OPPOSITE THE FIRST SIDE, WHEREIN THE FIRST SIDE INCLUDES ONE OR MORE METAL PADS, AND WHEREIN THE FIRST SIDE INCLUDES A DIELECTRIC LAYER SURROUNDING THE ONE OR MORE METAL PADS

602

PROVIDING A SUBSTRATE THAT INCLUDES ONE OR MORE METAL PADS ON A SIDE OF THE SUBSTRATE, WHEREIN THE SIDE OF THE SUBSTRATE INCLUDES A DIELECTRIC LAYER SURROUNDING THE ONE OR MORE METAL PADS

604

HYBRID BONDING THE FIRST SIDE OF THE DIE WITH THE SIDE OF THE SUBSTRATE

HYBRID BONDING A DIE TO A SUBSTRATE WITH VIAS CONNECTING METAL PADS ON BOTH SIDES OF THE DIE

FIELD

Embodiments of the present disclosure generally relate to the field of package assemblies, and in particular hybrid bonding of a die within a package.

BACKGROUND

Continued reduction in end product size of mobile electronic devices such as smart phones and ultrabooks is a driving force for reducing package component size and increasing package reliability.

BRIEF DESCRIPTION OF THE DRAWINGS

FIGS. 1A-1B illustrate various legacy implementations for bonding a die to a substrate.

FIGS. 4A-4F illustrate stages in a manufacturing process for hybrid bonding a die onto a substrate, in accordance with various embodiments.

FIG. 6 illustrates an example of a process for hybrid bonding a die to a substrate, in accordance with various embodiments.

DETAILED DESCRIPTION

Figure 2:
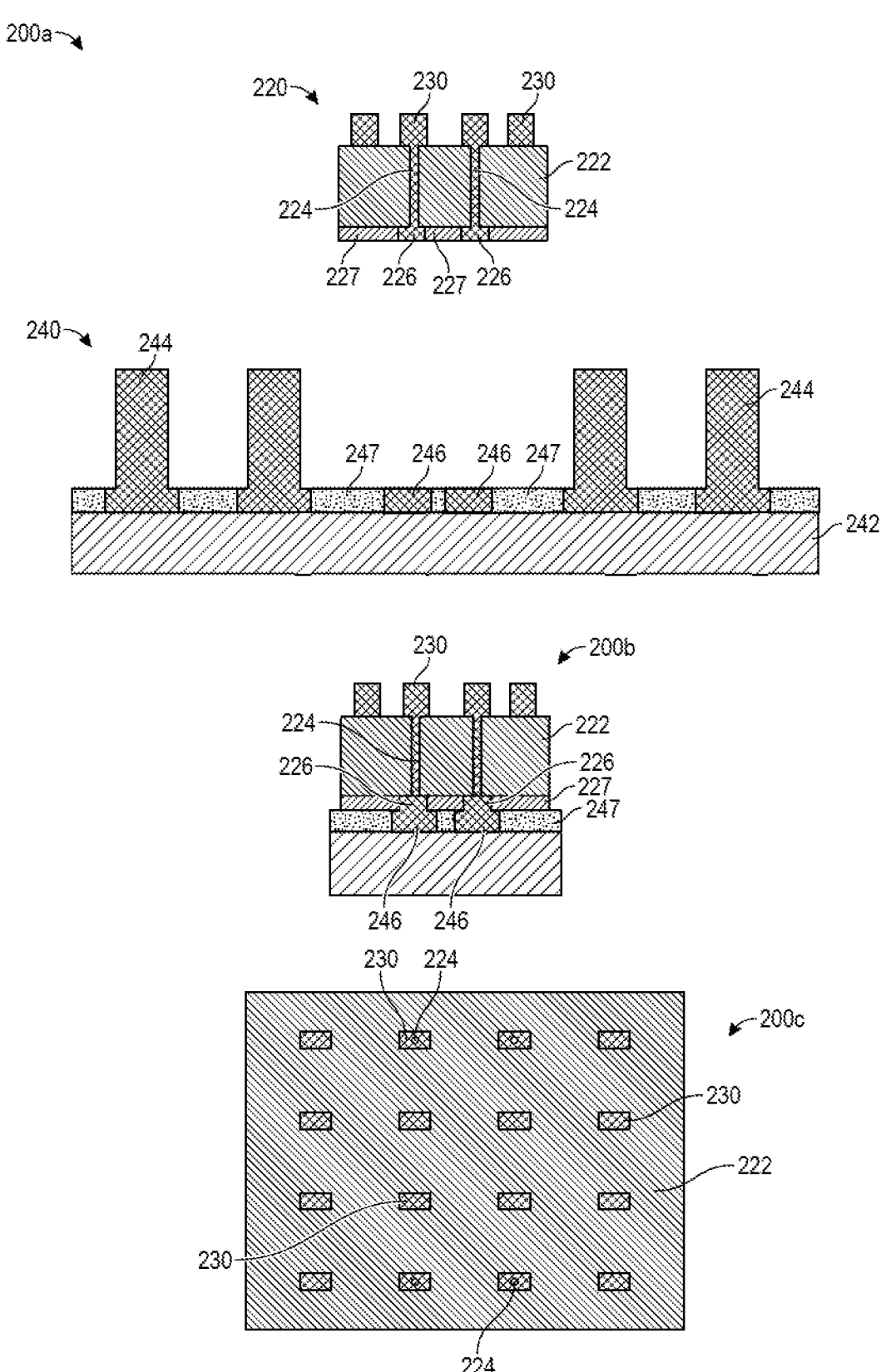
FIG. 2 illustrates a cross section side view and a top-down view of a die to be hybrid bonded to a substrate, in accordance with various embodiments.

Embodiments of the present disclosure may generally relate to systems, apparatus, techniques, and/or processes directed to facilitate the creation of complex packages by using hybrid bonding techniques to bond a die to a substrate. In embodiments, these same techniques may be used to bond a die to a die. In embodiments, a die may be a chiplet. In embodiments, the die may be a plurality of dies, where the plurality of dies are hybrid bonded to a substrate, to each other, or a combination of both.

In embodiments, the die may be hybrid bonded as part of an Omnidirectional Interconnect™ (ODI) or as part of another device component where the die serves as a bridge or a component in a bridge between one or more dies, between one or more interposers, or between a combination thereof. In embodiments, the die to be hybrid bonded may include a conductive metal via that extends from a first side of the die to a second side of the die opposite the first side. A metal pad may be coupled with the conductive metal via, and the metal pad may be used to hybrid bond the die to another metal pad on a substrate As requirements for interconnect bandwidth increase, package form factor reduction and layer count reduction are becoming increasingly important. Legacy implementations for bonding a die to a substrate may include creating a cavity within a substrate, and then attaching the die to the bottom of the cavity using a die attach film (DAF). Other legacy implementations may use a die that has solder bump connections on one surface of the die that solders to solder bumps on the substrate, where solder reflow physically and electrically couples the die to the substrate. Each of these legacy techniques may increase the number of layers and/or form factor sizes in comparison to embodiments described herein.

With embodiments described herein, there may be no DAF removal process, and furthermore the overall package may not need to be exposed to any chemistry during processing which may create quality issues. In addition, because hybrid bonding is used, there are no void concerns within small pitch regions between metal pads on the die and on the substrate. As a result, the die in the substrate will have a stronger bond, and be less sensitive to subsequent reflow processes because no intermetallic compounds (IMC) has been formed during the hybrid bonding process.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1B illustrate various legacy implementations for bonding a die to a substrate. FIG. 1A shows a legacy implementation of a cross section side view $100a_1$ and a top-down view $100a_2$ of a package that includes a substrate 102, with multiple layers 102a, 102b, 102c, 102d. A cavity 104 extends from the top of the substrate 102 to the bottom layer 102d, specifically extending to a metal 106. In implementations, the metal 106 may be a non-metal feature which may be referred to as a cavity interface material.

A die 110 may be placed within the cavity 104, on top of the metal 106 using a DAF 108. In implementations, the DAF 108 may be thermoplastic or thermosetting organic resin that may be incorporated with a conductive filler, and dried into sheets/film of thickness ranging anywhere between 10-40 μm. Examples of polymer resins that may be used in the DAF 108 include epoxies, maleimides, bismaleimides, acrylates, silicone, and/or cyanate esters.

The die 110 may include electrical contacts 112 on the top side of the die 110 that may electrically couple with other devices, such as other dies (not shown), subsequently in the legacy manufacturing process. In some implementations, there may be electrical contacts (not shown) near the bottom of the die 110, above the metal 106 and above the DAF 108. Note that in implementations, after the die 110 is bonded to the substrate 102, the remaining cavity 104 may be filled with a mold, a polymer, or some other filling agent.

In implementations, the DAF 108 material may have a limitation of lower mechanical strength that may result in the loosening or detachment of the die 110 from the substrate 102. In addition, if the DAF 108 has to be removed, a wet chemistry or a dry etch process is required in order to expose any backside copper pads (not shown) on the die 110 to enable vertical electrical connections through the backside of the substrate 102.

FIG. 1B shows a legacy implementation of a cross section side view $100b_1$ of a die 120 that includes a die body 122, that may have electrically conductive vias 124 running from a first side of the die body 122 to a second side of the die body 122 opposite the first side. Note that electrically conductive vias 124 may be also referred to as through silicon vias (TSV). In implementations, top metal pads 130 may couple with some of the electrically conductive vias 124 at the first side of the die body 122, and bottom metal pads 126 may couple with the electrically conductive vias 124 at the second side of the die body 122. Note that the bottom metal pads 126 may include solder balls 128 in preparation for physical and/or electrical coupling with the substrate 140.

Substrate 140 may include a substrate layer 142, which in some implementations may be referred to as a carrier. Substrate 140 may include copper pillars 144 that are attached to the substrate layer 142, as well as metal pads 146 also attached to the substrate layer 142. In implementations, there may be a layer 150, that may include routing features (not shown), above the substrate layer 142. Note that the metal pads 146 may have solder balls 148 on top of them.

In legacy implementations, the die 120 may be connected with the substrate 140 by soldering the bottom metal pads 126 with the metal pads 146 of the substrate 140. This may be accomplished by coupling the solder balls 128 with solder balls 148 and then applying a reflow process. This may be referred to as a "solder to solder" joining of the die 120 to the substrate 140.

These legacy implementations have drawbacks. First, when a smaller pitch and bump size is applied, there may be at most a full layer of intermetallic compound (IMC) 149 formed at the solder interface. Diagram $100b_2$ shows a cross-section image of a solder joint formed by solder 148 on metal pad 146 coming into contact with solder 128 on bottom metal pad 126. As a result of the reflow process, an excess amount of IMC 149 is formed, which poses significant reliability challenges for the operation of the resulting device. In addition, because of the smaller pitch used for the bottom metal pads 126 and metal pads 146, it is far easier to create encapsulation voids during the encapsulation process, resulting in a weaker bond. In addition, the reflow process will exert additional thermal history to the package, which may further compromise the structural integrity of the package.

FIG. 2 illustrates a cross section side view and a top-down view of a die to be hybrid bonded to a substrate, in accordance with various embodiments. Diagram 200a is a cross section side view of a die 220 and a substrate 240. The die 220 may include a die body 222 that may have electrically conductive vias 224 running from a first side of the die body 222 to a second side of the die body 222 opposite the first side. In implementations, top metal pads 230 couple with some of the electrically conductive vias 224 at the first side of the die body 222. Bottom metal pads 226 may couple with the electrically conductive vias 224 at the second side of the die body 222. In embodiments, a dielectric 227 may be on the bottom side of the die body 222, and surround bottom metal pads 226. In embodiments, the dielectric 227 may be a Polyimide, or some other dielectric material that may be used during hybrid bonding. Diagram 200c shows a top-down view of die 220.

Substrate 240 may include a substrate layer 242. In some embodiments, substrate layer 242 may be a silicon layer. In some embodiments, substrate layer 242 may be a carrier that may be made out of a glass or some other material, that may be eventually removed during processing. Substrate 240 may include copper pillars 244 that are attached to the substrate layer 242, as well as metal pads 246 also attached to the substrate layer 242. In embodiments, a dielectric 247 may be on the substrate layer 242, and surround the metal pads 246. In embodiments, the dielectric 247 may be a Polyimide that may be used during hybrid bonding.

Diagram 200b is a cross section side view of the result of die 220 being hybrid bonded to substrate 240. The bottom metal pads 226 and the metal pads 246, which may include copper, have been fused. In addition, the dielectric 227 and the dielectric 247, which may include a Polyimide, have also been fused. Note that in embodiments, the entire surface area of the die 220 that includes the dielectric 227 and the bottom metal pads 226 have been directly physically coupled with the substrate 240. In embodiments, the metal pads 246 of the substrate 240 may be coupled with metallic routings (not shown) elsewhere on the substrate 240. In embodiments, the vias 224 that connect with the top metal pads 230 may provide electrical connection from the substrate 240 through the die 220. Note that in embodiments, in this configuration, the die 220 may serve as a bridge die that may be used to bridge other devices attached to a top of the die 220.

Figure 3:
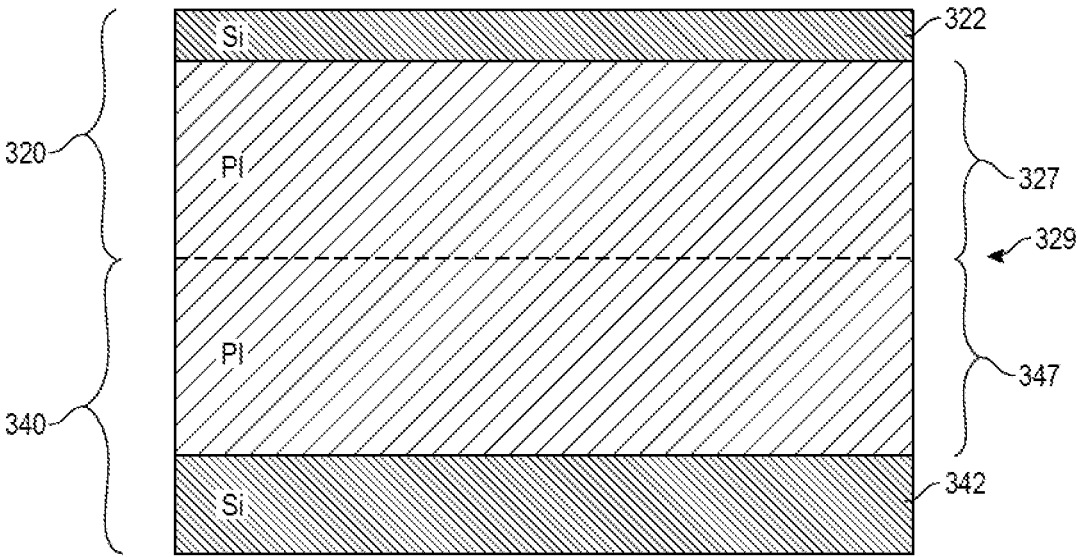
FIG. 3 illustrates an image of a cross section side view of cured Polyimide layer bonding between two substrates.

FIG. 3 illustrates an image of a cross section side view of cured Polyimide layer bonding between two substrates. Layers 320 may represent the bottom portion of the die 220 of FIG. 2, and layers 340 may represent a portion of the substrate 240 to which the die 220 is to be attached. Silicon layer 322, which may be similar to a portion of the die body 222, is above a Polyimide layer 327, which may be similar to dielectric layer 227. Directly below Polyimide layer 327 is another Polyimide layer 347, which may be similar to dielectric layer 247, and on top of silicon layer 342 which may be similar to a portion of substrate layer 242. As shown, the two Polyimide layers 327, 347 have cured and then bonded, with no void in the interface 329 between them.

Figure 4A:
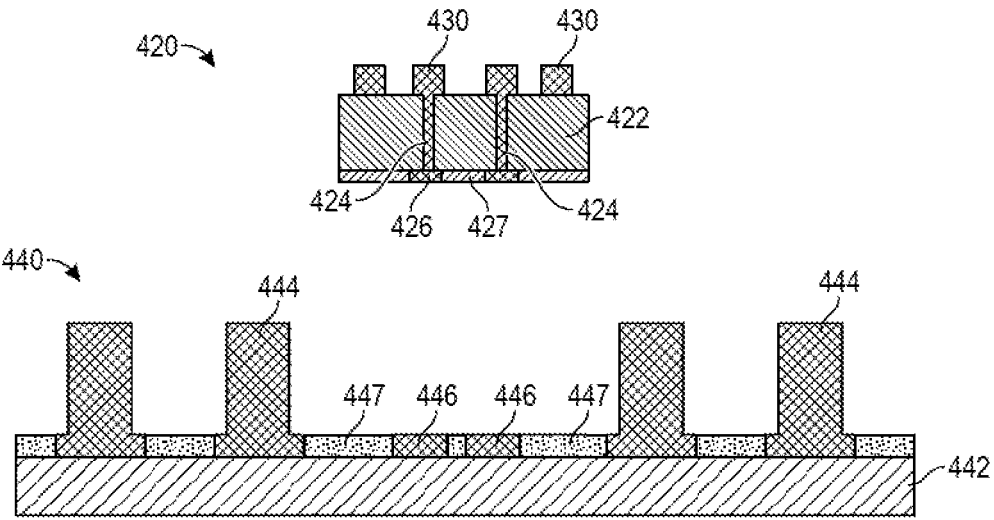

FIGS. 4A-4F illustrate stages in a manufacturing process for hybrid bonding a die onto a substrate, in accordance with various embodiments. In embodiments, the die may be a chip. FIG. 4A shows a cross section side view of a stage in the manufacturing process where a die 420 and a substrate 440, which may be similar to die 220 and substrate 240 of FIG. 2, are provided. The die 420 may include a die body 422 that may have electrically conductive vias 424 running from a first side of the die body 422 to a second side of the die body 422 opposite the first side. In implementations, top metal pads 430 may couple with some of the electrically conductive vias 424 at the first side of the die body 422, and bottom metal pads 426 may couple with the electrically conductive vias 424 at the second side of the die body 422 opposite the first side. In embodiments, a dielectric 427 may be on the bottom side of the die body 422, and surround bottom metal pads 426. In embodiments, the dielectric 427 may be a Polyimide, or some other dielectric material that may be used during hybrid bonding. In embodiments, electronic circuitry or other electronic components (not shown) may be within the die body 422, and may be electrically coupled with the vias 424 within the die 420.

Substrate 440 may include a substrate layer 442, which in some embodiments may be referred to as a carrier. Substrate 440 may include copper pillars 444 that are attached to the substrate layer 442, as well as metal pads 446 that are also attached to the substrate layer 442. In embodiments, a dielectric 447 may be on the substrate layer 442, and surround the metal pads 446. In embodiments, the substrate layer 442 may be a glass layer that serves as a carrier, which may later be removed. In embodiments, the dielectric 447 may be a Polyimide that may be used during hybrid bonding in the subsequent manufacturing process stage.

Figure 4B:
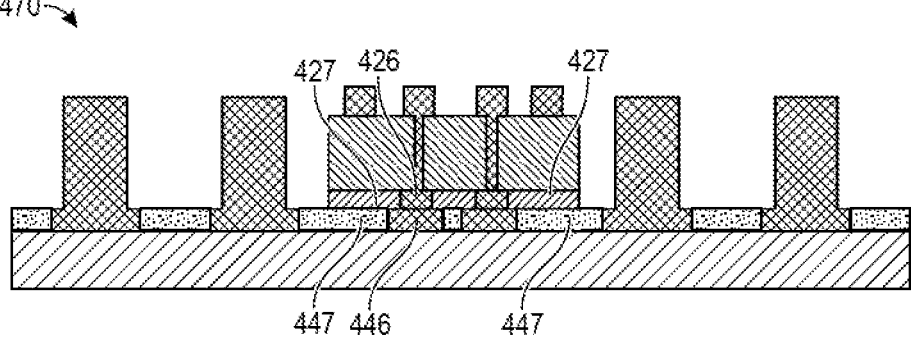

FIG. 4B shows a cross section side view of a stage in the manufacturing process where the die 420 and the substrate 440 from FIG. 4A are hybrid bonded to each other. As a result of hybrid bonding, the bottom metal pads 426 of the die are bonded with the metal pads 446 of the substrate, and the dielectric 427 of the die 420 is bonded with the dielectric 447 of the substrate 440.

The hybrid bonding process may be a part of a thermal compression bonding (TCB) process that may involve a series of stages. For example, a first stage of the hybrid bonding process may involve bringing the dielectric 427 of the die 420 into physical contact with the dielectric 447 of the substrate 440, where the bottom metal pads 426 and metal pads 446 are aligned with each other. This may be done at a lower temperature, for example at an ambient room temperature. A second stage of the hybrid bonding process may involve applying heat so that the bottom metal pads 426 and the metal pads 446 are brought into physical contact with each other. A third stage of a hybrid bonding process may involve applying further heat to compress the bottom metal pads 426 and the metal pads 446, creating a bonding between them, as well as a bonding between the dielectric 427 and the dielectric 447. The result is device 470.

FIG. 4C shows a cross section side view of a stage in the manufacturing process where the device 470 is encapsulated with a mold 460. In embodiments, the mold 460 may be applied using compression molding techniques, or other molding application techniques. In embodiments, the mold 460 may include any molding compound that may provide good encapsulation performance and good mechanical reliability.

FIG. 4D shows a cross section side view of a stage in the manufacturing process where a grinding or polishing process is applied to planarize and to remove a portion 462 of the mold 460. As a result, tops of copper pillars 444, as well as tops of top metal pads 430 will be exposed.

FIG. 4E shows a cross section side view of a stage in the manufacturing process where dies 470, 472 are coupled with the top metal pads 430 and the copper pillars 444. In this embodiment, metal pads 446 may be electrically coupled with the dies 470, 472 through the bottom metal pads 426 and the conductive vias 424. It should be noted that two dies 470, 472 are shown here, however in other embodiments a single die or any number of multiple dies may be electrically coupled with the pillars 444 or the top metal pads 430. An encapsulation material 474, which may also serve as an underfill material, may be placed around or at least partially around the dies 470, 472.

FIG. 4F shows a cross section side view of a stage in the manufacturing process where the substrate layer 442 of FIG. 4E is a glass carrier that has been debonded 476. In subsequent manufacturing stages, the device of FIG. 4F may be attached to another substrate.

FIGS. 5A-5K illustrate stages in a manufacturing process for creating a die for hybrid bonding to a substrate, in accordance with various embodiments. The manufacturing stages shown below with respect to FIGS. 5A-5K may be used to produce a die that may be similar to die 220 of FIG. 2 or die 420 of FIG. 4A.

Figure 5A:
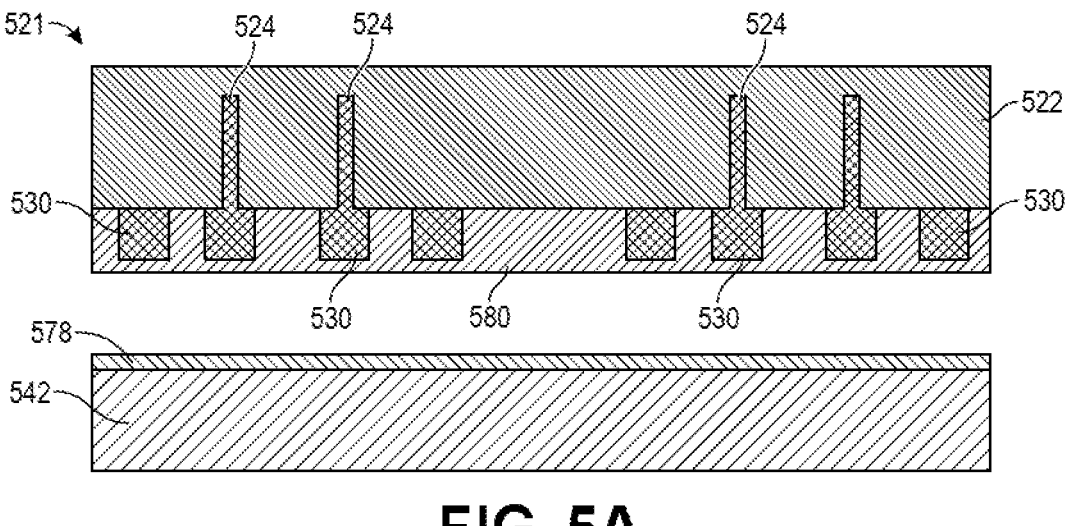
FIGS. 5A-5K illustrate stages in a manufacturing process for creating a die for hybrid bonding to a substrate, in accordance with various embodiments.

FIG. 5A shows a cross section side view of a stage in the manufacturing process where a glass carrier 542 may be provided. In embodiments, the glass carrier 542 may be a panel made of glass to serve as a temporary support that will later be removed. In embodiments, a laser release layer 578 may be physically coupled with a side of the glass carrier 542. In embodiments, a wafer 521 or a portion of a wafer may be provided, that includes a die body 522, and a plurality of top metal pads 530, which may be similar to the top metal pads 230 of FIG. 2. Note that subsequent stages in the manufacturing process will flip orientation of the wafer 521 so that the top metal pads 530 will be at the top.

In embodiments, conductive vias 524 may be created that electrically couple with at least some of the top metal pads 530. In embodiments, the conductive vias 524 may be formed by first drilling out a via, and filling the drilled via with a conductive metal, such as copper. Note that the wafer 521 may include multiple die structures that are similar to die 220 of FIG. 2, which will be diced later. The top metal pads 530 may be surrounded by a dielectric material 580.

Figure 5B:
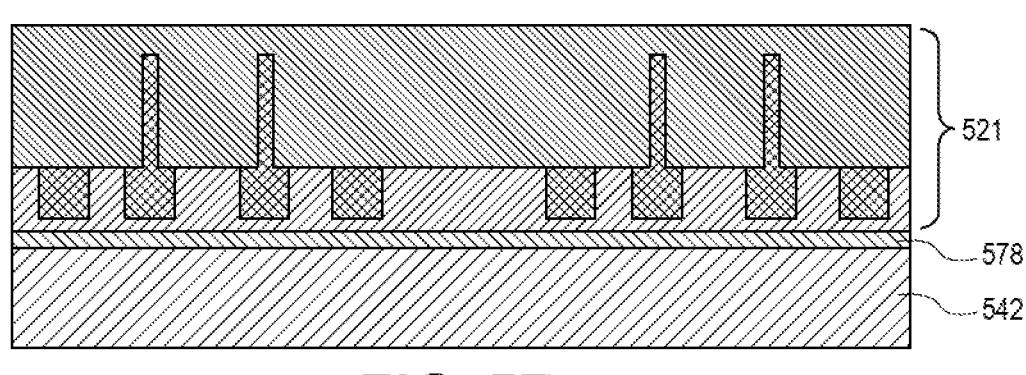

FIG. 5B shows a cross section side view of a stage in the manufacturing process where the wafer 521 is bonded with the laser release layer 578 on top of the glass carrier 542 to form a structure 582.

Figure 5C:
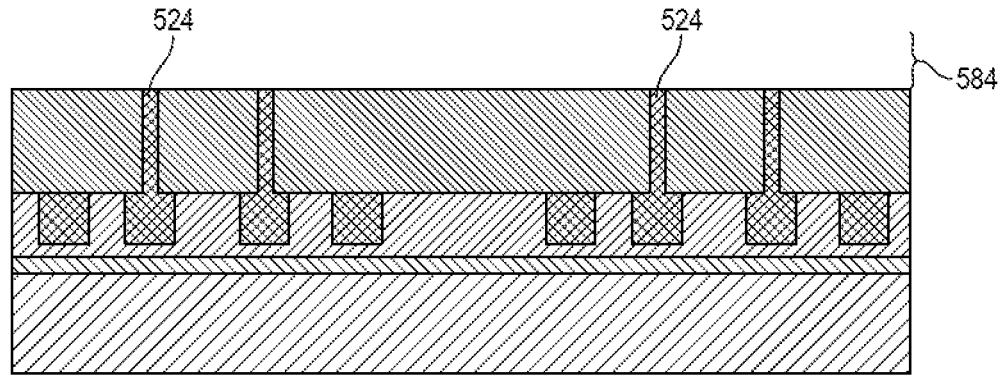

FIG. 5C shows a cross section side view of a stage in the manufacturing process where a portion 584 of the die body 522 is ground to expose the conductive vias 524.

Figure 5D:
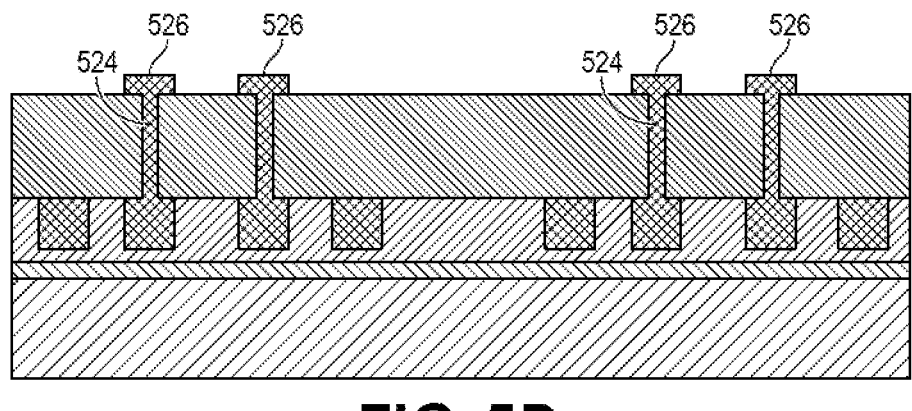

FIG. 5D shows a cross section side view of a stage in the manufacturing process where the bottom metal pads 526, which may be similar to the bottom metal pads 226 of FIG. 2, are placed proximate to the conductive vias 524. In embodiments, the bottom metal pads 526 may be formed as a patterned copper bump.

Figure 5E:
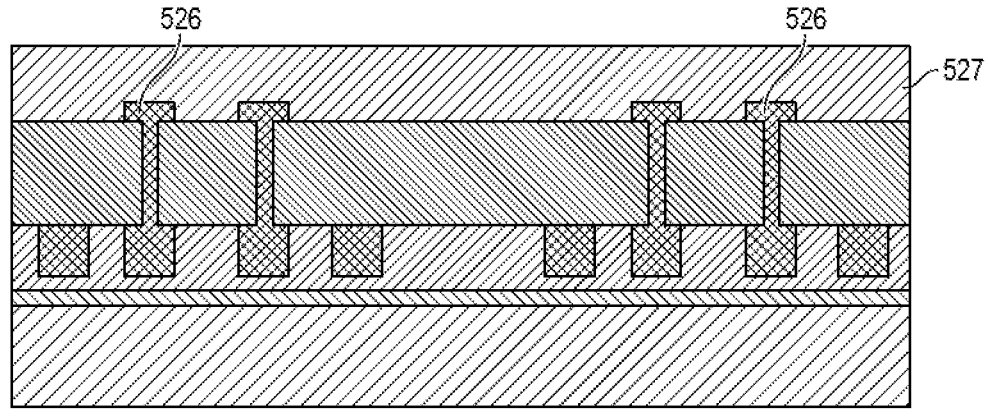

FIG. 5E shows a cross section side view of a stage in the manufacturing process where a dielectric 527 is placed above and around the bottom metal pads 526. In embodiments, the dielectric 527 may be similar to dielectric 227 of FIG. 2, and may include a Polyimide or other dielectric that may be used for subsequent hybrid bonding processes.

Figure 5F:
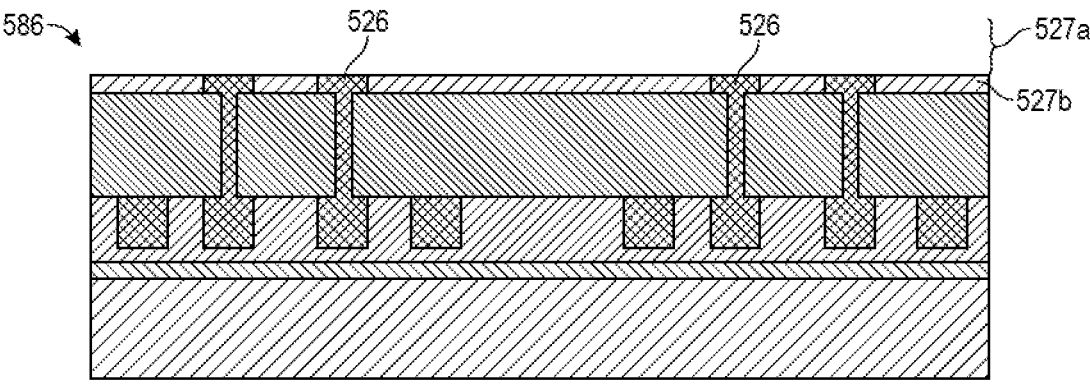

FIG. 5F shows a cross section side view of a stage in the manufacturing process where a portion 527*a* of the dielectric 527 is ground or polished, for example by a chemical mechanical planarization (CMP) process, to a level of the bottom metal pads 526. The remaining dielectric 527*b* surrounds the bottom metal pads 526. The result of this stage is structure 586.

Figure 5G:
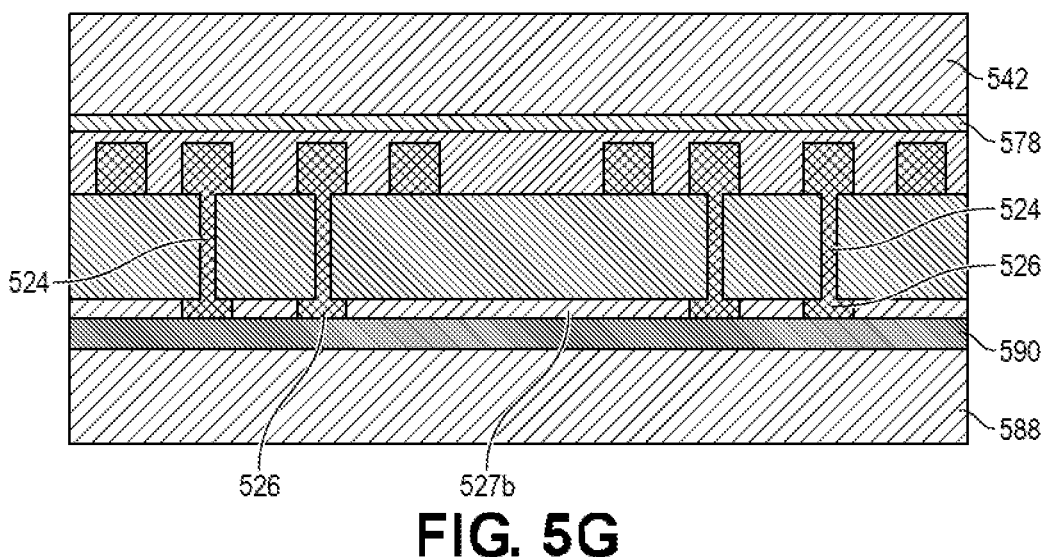

FIG. 5G shows a cross section side view of a stage in the manufacturing process where the structure 586 of FIG. 5F is flipped, and the bottom metal pads 526 that are coupled with the electrically conductive vias 524, and the dielectric 527*b* are physically coupled with a lamination layer 590 on top of a dicing tape 588. In embodiments, lamination layer 590 may be an adhesive layer on top of dicing tape 588.

Figure 5H:
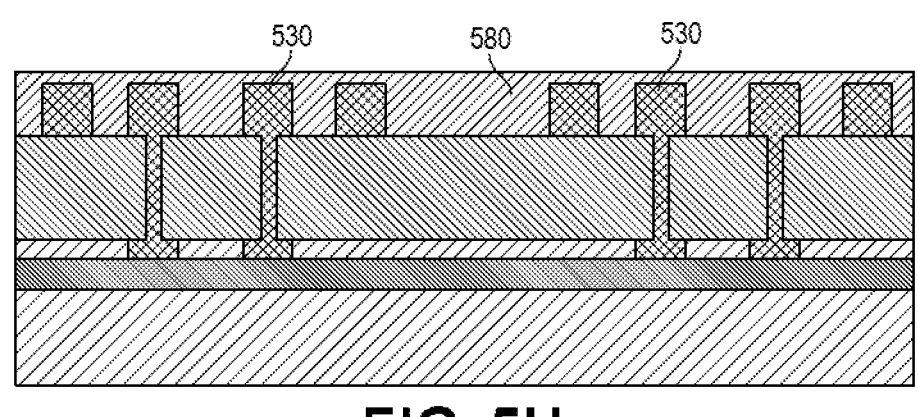

FIG. 5H shows a cross section side view of a stage in the manufacturing process where the glass carrier 542 and the laser release layer 578 are removed, leaving dielectric material 580 that surrounds the top metal pads 530.

Figure 5I:
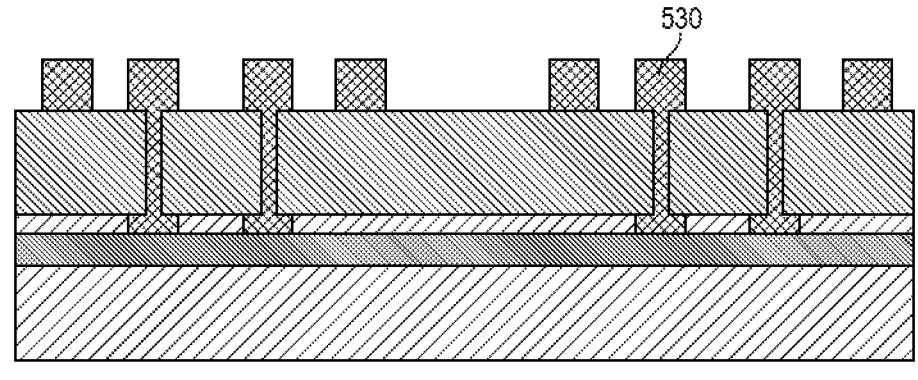

FIG. 5I shows a cross section side view of a stage in the manufacturing process where the dielectric material 580 is removed. In embodiments, a wet etch process or a dry etch process may be used to remove the dielectric material 580.

Figure 5J:
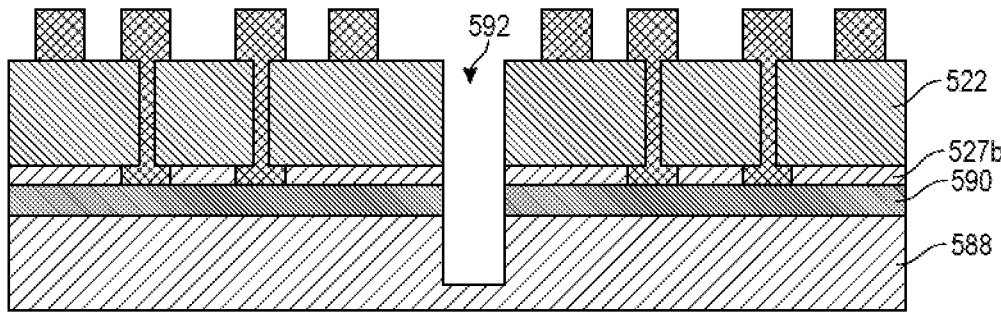

FIG. 5J shows a cross section side view of a stage in the manufacturing process where a cut 592 may be made through the die body 522, through the dielectric layer 527*b*, through the lamination layer 590, and into the dicing tape 588. This stage may be referred to as a singulation process.

Figure 5K:
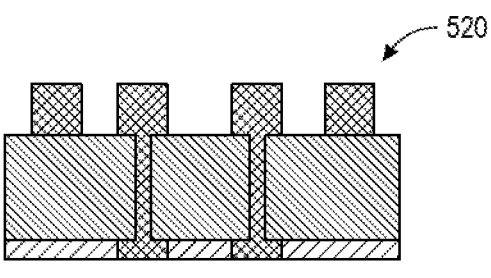

FIG. 5K shows a cross section side view of the stage in the manufacturing process where a singulated die 520 is shown after the dicing tape 588 and the laminate 590 have been removed. In embodiments, the singulated die 520 may be referred to as a chiplet, and may be similar to die 220 of FIG. 2.

FIG. 6 illustrates an example of a process for hybrid bonding a die to a substrate, in accordance with various embodiments. Process 600 may be performed by one or more elements, techniques, or systems that may be described herein, and in particular with respect to FIGS. 1-5J.

At block 602, the process may include providing a die that has a first side and a second side opposite the first side, wherein the first side includes one or more metal pads, and wherein the first side includes a dielectric layer surrounding the one or more metal pads. The die, the metal pads, and the dielectric layer may be similar to die 220, bottom metal pads 226 and dielectric layer 227 of FIG. 2, die 420, bottom metal pads 426 and dielectric layer 427 of FIG. 4A, or die 520, bottom metal pads 526, and dielectric layer 527*b* of FIGS. 5J-5K.

At block 604, the process may further include providing a substrate that includes one or more metal pads on a side of the substrate, wherein the side of the substrate includes a dielectric layer surrounding the one or more metal pads. In embodiments, the substrate, metal pads, and dielectric layer surrounding the metal pads may be similar to substrate 240, metal pads 246, and dielectric layer 247 of FIG. 2, or substrate 440, metal pads 446, and dielectric layer 447 of FIG. 4A.

At block 606, the process may further include hybrid bonding the first side of the die with the side of the substrate. In embodiments, the hybrid bonding process may be similar to the process shown with respect to diagram 200*b* of FIG. 2, or structure 470 of FIG. 4B.

Figure 7A:
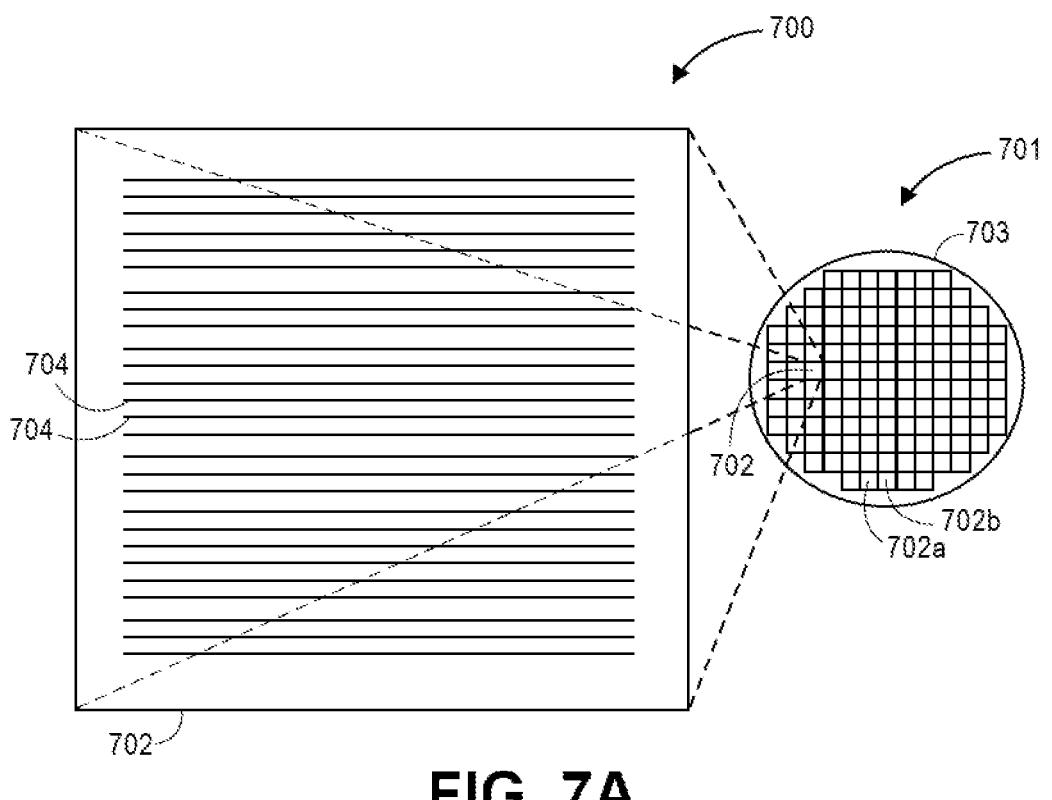
FIGS. 7A-7B schematically illustrate a top view of an example die in wafer form and in singulated form, and a cross section side view of a package assembly, in accordance with various embodiments.
Figure 7B:
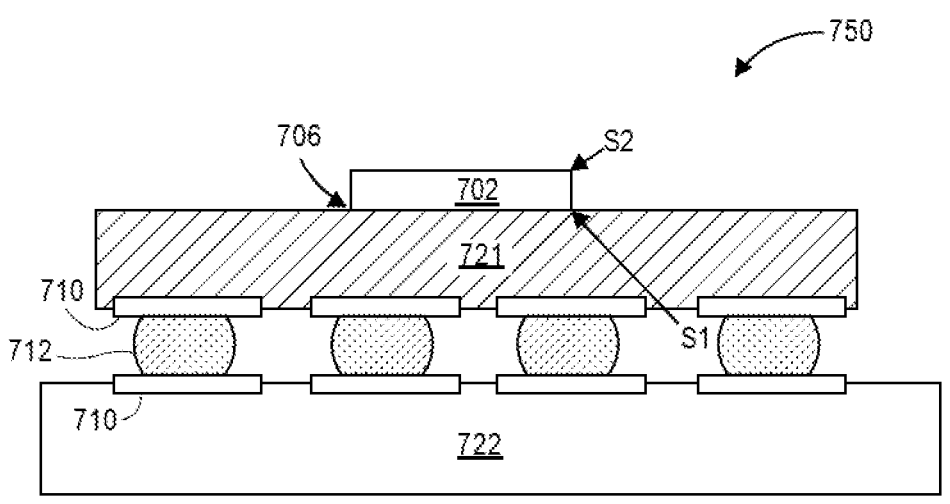

FIGS. 7A-7B schematically illustrate a top view of an example die in wafer form and in singulated form, and a cross section side view of a package assembly, in accordance with various embodiments. FIG. 7A schematically illustrates a top view of an example die 702 in a wafer form 701 and in a singulated form 700, in accordance with some embodiments. In some embodiments, die 702 may be one of a plurality of dies, e.g., dies 702, 702*a*, 702*b*, of a wafer 703 comprising semiconductor material, e.g., silicon or other suitable material. The plurality of dies, e.g., dies 702, 702*a*, 702*b*, may be formed on a surface of wafer 703. Each of the dies 702, 702*a*, 702*b*, may be a repeating unit of a semiconductor product that includes devices as described herein. For example, die 702 may include circuitry having elements such as capacitors and/or inductors 704 (e.g., fin structures, nanowires, and the like) that provide a channel pathway for mobile charge carriers in transistor devices. Although one or more capacitors and/or inductors 704 are depicted in rows that traverse a substantial portion of die 702, it is to be understood that one or more capacitors and/or inductors 704 may be configured in any of a wide variety of other suitable arrangements on die 702 in other embodiments.

After a fabrication process of the device embodied in the dies is complete, wafer 703 may undergo a singulation process in which each of dies, e.g., die 702, is separated from one another to provide discrete "chips" of the semiconductor product. Wafer 703 may be any of a variety of sizes. In some embodiments, wafer 703 has a diameter ranging from about 25.4 mm to about 450 mm. Wafer 703 may include other sizes and/or other shapes in other embodiments. According to various embodiments, the one or more capacitors and/or inductors 704 may be disposed on a semiconductor substrate in wafer form 701 or singulated form 700. One or more capacitors and/or inductors 704 described herein may be incorporated in die 702 for logic, memory, or combinations thereof. In some embodiments, one or more capacitors and/or inductors 704 may be part of a system-on-chip (SoC) assembly.

FIG. 7B schematically illustrates a cross-section side view of an integrated circuit (IC) assembly 750, in accordance with some embodiments. In some embodiments, IC assembly 750 may include one or more dies, e.g., die 702, electrically or physically coupled with a package substrate 721. Die 702 may include one or more capacitors and/or inductors 704 as described herein. In some embodiments, package substrate 721 may be electrically coupled with a circuit board 722 as is well known to a person of ordinary skill in the art. Die 702 may represent a discrete product made from a semiconductor material (e.g., silicon) using semiconductor fabrication techniques such as thin film deposition, lithography, etching, and the like. In some embodiments, die 702 may be, include, or be a part of a processor, memory, SoC or ASIC in some embodiments.

Die 702 can be attached to package substrate 721 according to a wide variety of suitable configurations including, for example, being directly coupled with package substrate 721 in a flip-chip configuration, as depicted. In the flip-chip configuration, an active side S1 of die 702 including circuitry is attached to a surface of package substrate 721 using hybrid bonding structures as described herein that may also electrically couple die 702 with package substrate 721. Active side S1 of die 702 may include multi-threshold voltage transistor devices as described herein. An inactive side S2 of die 702 may be disposed opposite to active side S1.

In some embodiments, package substrate 721 is an epoxy-based laminate substrate having a core and/or build-up layers such as, for example, an Ajinomoto Build-up Film (ABF) substrate. Package substrate 721 may include other suitable types of substrates in other embodiments including, for example, substrates formed from glass, ceramic, or semiconductor materials.

Package substrate 721 may include electrical routing features configured to route electrical signals to or from die 702. The electrical routing features may include pads or traces (not shown) disposed on one or more surfaces of package substrate 721 and/or internal routing features (not shown) such as trenches, vias, or other interconnect structures to route electrical signals through package substrate 721. In some embodiments, package substrate 721 may include electrical routing features such as pads (not shown) configured to receive the respective die-level interconnect structures 706 of die 702.

Circuit board 722 may be a printed circuit board (PCB) comprising an electrically insulative material such as an epoxy laminate. Circuit board 722 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures such as traces, trenches, vias may be formed through the electrically insulating layers to route the electrical signals of die 702 through circuit board 722. Circuit board 722 may comprise other suitable materials in other embodiments. In some embodiments, circuit board 722 is a motherboard as is well known to a person of ordinary skill in the art.

Package-level interconnects such as, for example, solder balls 712 may be coupled to one or more pads 710 on package substrate 721 and/or on circuit board 722 to form corresponding solder joints that are configured to further route the electrical signals between package substrate 721 and circuit board 722. Pads 710 may comprise any suitable electrically conductive material such as metal including, for example, nickel (Ni), palladium (Pd), gold (Au), silver (Ag), copper (Cu), and combinations thereof. Other suitable techniques to physically and/or electrically couple package substrate 721 with circuit board 722 may be used in other embodiments.

IC assembly 750 may include a wide variety of other suitable configurations in other embodiments including, for example, suitable combinations of flip-chip and/or wire-bonding configurations, interposers, multi-chip package configurations including system-in-package (SiP), and/or package-on-package (PoP) configurations. Other suitable techniques to route electrical signals between die 702 and other components of IC assembly 750 may be used in some embodiments.

A person of ordinary skill in the art should recognize that any known semiconductor device fabricated using any known semiconductor process that may benefit from the principles described herein.

Figure 8:
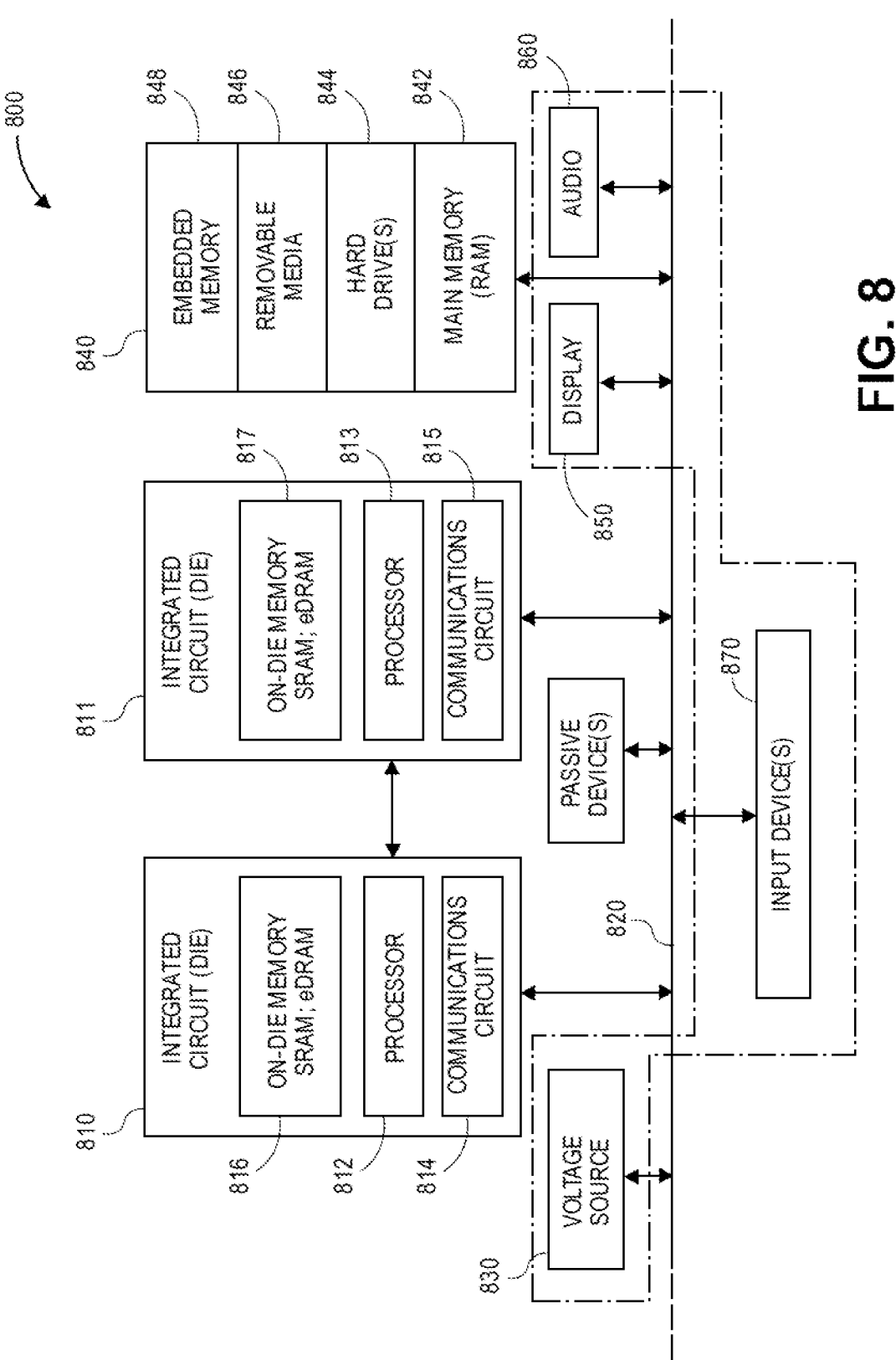
FIG. 8 schematically illustrates a computing device, in accordance with embodiments.

FIG. 8 is a schematic of a computer system 800, in accordance with an embodiment of the present invention. The computer system 800 (also referred to as the electronic system 800) as depicted can embody hybrid bonding a die to a substrate with vias connecting metal pads on both sides of the die, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, hybrid bonding a die to a substrate with vias connecting metal pads on both sides of the die, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having hybrid bonding a die to a substrate with vias connecting metal pads on both sides of the die, according to any of the several disclosed embodiments and their equivalents, an electronic system, a computer system, one or more methods of fabricating an integrated circuit, and one or more methods of fabricating an electronic assembly that includes a package substrate having hybrid bonding a die to a substrate with vias connecting metal pads on both sides of the die, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having hybrid bonding a die to a substrate with vias connecting metal pads on both sides of the die embodiments and their equivalents. A foundation substrate may be included, as represented by the dashed line of FIG. 8. Passive devices may also be included, as is also depicted in FIG. 8.

EXAMPLES

The following paragraphs describe examples of various embodiments.

Example 1 is an electronic device comprising: a substrate; a metal pad on a side of the substrate; a dielectric material on the side of the substrate, the dielectric material surrounding the metal pad; a die having a first side and a second side opposite the first side, the first side of the die includes a metal pad and a dielectric material surrounding the metal pad; and wherein the first side of the die is hybrid bonded to the side of the substrate, wherein the metal pad on the side of the substrate is directly bonded to the metal pad of the first side of the die, and wherein the dielectric material on the side of the substrate is directly bonded to the dielectric material on the first side of the die.

Example 2 includes the electronic device of example 1, or of any other example or embodiment herein, wherein the dielectric material includes Polyimide.

Example 3 includes electronic device of example 1, or of any other example or embodiment herein, wherein the metal pad on the side of the substrate is an active metal pad.

Example 4 includes electronic device of example 1, or of any other example or embodiment herein, wherein the metal pad on the first side of the die is electrically coupled with a via that extends from the first side of the die to the second side of the die.

Example 5 includes electronic device of example 4, or of any other example or embodiment herein, wherein the via extends from the metal pad on the first side of the die to a metal pad on the second side of the die.

Example 6 includes electronic device of example 4, or of any other example or embodiment herein, wherein the die includes electronic circuitry, and wherein the via is electrically coupled with the electronic circuitry.

Example 7 includes electronic device of example 1, or of any other example or embodiment herein, wherein the metal pad on the side of the substrate is a plurality of metal pads, and wherein the metal pad on the first side of the die is a plurality of metal pads.

Example 8 includes electronic device of example 7, or of any other example or embodiment herein, where at least some of the plurality of metal pads on the side of the substrate are active metal pads.

Example 9 includes electronic device of example 1, or of any other example or embodiment herein, wherein the first side of the die is hybrid bonded at a bottom of a cavity within the substrate.

Example 10 includes electronic device of example 1, or of any other example or embodiment herein, wherein the die is a bridge die.

Example 11 includes electronic device of example 1, or of any other example or embodiment herein, wherein the die is a first die; and further comprising a second die, wherein the second die is directly coupled with the second side of the first die.

Example 12 includes electronic device of example 1, or of any other example or embodiment herein, wherein the device is a portion of an omnidirectional interconnect (ODI).

Example 13 is a die comprising: a first side and a second side opposite the first side; one or more metal pads on the first side; a dielectric material on the first side surrounding the one or more metal pads; and one or more vias extending from the first side to the second side, the one or more vias directly electrically coupled, respectively, from one of the one or more metal pads on the first side to one of one or more metal pads on the second side.

Example 14 includes the die of example 13, or of any other example or embodiment herein, further comprising a dielectric layer on the first side, the dielectric layer surrounding the one or more metal pads.

Example 15 includes the die of example 14, or of any other example or embodiment herein, wherein the dielectric layer includes Polyimide.

Example 16 includes the die of example 13, or of any other example or embodiment herein, wherein the die includes electrical circuitry, and wherein at least one of the one or more vias electrically couple with the electrical circuitry.

Example 17 is a method comprising: providing a die that has a first side and a second side opposite the first side, wherein the first side includes one or more metal pads, and wherein the first side includes a dielectric layer surrounding the one or more metal pads; providing a substrate that includes one or more metal pads on a side of the substrate, wherein the side of the substrate includes a dielectric layer surrounding the one or more metal pads; and hybrid bonding the first side of the die with the side of the substrate.

Example 18 may include the method of example 17, or of any other example or embodiment herein, wherein hybrid bonding the first side of the die with the side of the substrate further includes: placing the first side of the die on the side of the substrate, wherein at least a subset of the one or more metal pads of the first side of the die are in direct physical contact with at least a subset of the one or more metal pads on the side of the substrate, and wherein the dielectric layer on the first side of the die is in direct physical contact with the dielectric layer on the side of the substrate; and applying heat to the die and the substrate.

Example 19 includes the method of example 17, or of any other example or embodiment herein, wherein providing a die further includes: providing a die that includes one or more vias that directly electrically couple, respectively, with at least one of the one or more metal pads on the first side, wherein each of the one or more vias electrically couple with a metal pad at the second side of the die.

Example 20 includes the method of example 17, or of any other example or embodiment herein, wherein the metal pads include copper.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An electronic device comprising:
a substrate;
a metal pad on a side of the substrate;
a dielectric material on the side of the substrate, the dielectric material surrounding the metal pad;
a die having a first side and a second side opposite the first side, the first side of the die includes a metal pad and a dielectric material surrounding the metal pad; and
wherein the metal pad on the side of the substrate is directly bonded to the metal pad of the first side of the die, and wherein the dielectric material on the side of the substrate is directly bonded to the dielectric material on the first side of the die.

2. The electronic device of claim 1, wherein the dielectric material on the side of the substrate or the dielectric material surrounding the metal pad includes Polyimide.

3. The electronic device of claim 1, wherein the metal pad on the side of the substrate includes copper.

4. The electronic device of claim 1, wherein the metal pad on the first side of the die is electrically coupled with a via that extends from the first side of the die to the second side of the die.

5. The electronic device of claim 4, wherein the via extends from the metal pad on the first side of the die to a metal pad on the second side of the die.

6. The electronic device of claim 4, wherein the die includes electronic circuitry, and wherein the via is electrically coupled with the electronic circuitry.

7. The electronic device of claim 1, wherein the metal pad on the side of the substrate is a plurality of metal pads, and wherein the metal pad on the first side of the die is a plurality of metal pads.

8. The electronic device of claim 7, where at least some of the plurality of metal pads on the side of the substrate include copper.

9. The electronic device of claim 1, wherein the first side of the die is hybrid bonded at a bottom of a cavity within the substrate.

10. The electronic device of claim 1, wherein the die is a bridge die.

11. The electronic device of claim 1, wherein the die is a first die; and further comprising a second die, wherein the second die is directly coupled with the second side of the first die.

12. The electronic device of claim 1, further comprising one or more metal pillars adjacent the die.

13. A die comprising:
a first side and a second side opposite the first side;
one or more metal pads on the first side;
a dielectric material on the first side surrounding the one or more metal pads; and
one or more vias extending from the first side to the second side, the one or more vias directly electrically coupled, respectively, from one of the one or more metal pads on the first side to one of one or more metal pads on the second side.

14. The die of claim 13, further comprising a dielectric layer on the first side, the dielectric layer surrounding the one or more metal pads.

15. The die of claim 14, wherein the dielectric layer includes Polyimide.

16. The die of claim 13, wherein the die includes electrical circuitry, and wherein at least one of the one or more vias electrically couple with the electrical circuitry.

17. A method comprising:
providing a die that has a first side and a second side opposite the first side, wherein the first side includes one or more metal pads, and wherein the first side includes a dielectric layer surrounding the one or more metal pads;
providing a substrate that includes one or more metal pads on a side of the substrate, wherein the side of the substrate includes a dielectric layer surrounding the one or more metal pads; and
hybrid bonding the first side of the die with the side of the substrate.

18. The method of claim 17, wherein hybrid bonding the first side of the die with the side of the substrate further includes:
placing the first side of the die on the side of the substrate, wherein at least a subset of the one or more metal pads of the first side of the die are in direct physical contact with at least a subset of the one or more metal pads on the side of the substrate, and wherein the dielectric layer on the first side of the die is in direct physical contact with the dielectric layer on the side of the substrate; and
applying heat to the die and the substrate.

19. The method of claim 17, wherein providing a die further includes:
providing a die that includes one or more vias that directly electrically couple, respectively, with at least one of the one or more metal pads on the first side, wherein each of the one or more vias electrically couple with a metal pad at the second side of the die.

20. The method of claim 17, wherein the metal pads include copper.

\* \* \* \* \*